(12) United States Patent
Wing

(10) Patent No.: US 6,690,192 B1
(45) Date of Patent: Feb. 10, 2004

(54) CURRENT-COMPENSATED CMOS OUTPUT BUFFER ADJUSTING EDGE RATE FOR PROCESS, TEMPERATURE, AND VCC VARIATIONS

(75) Inventor: Choy Kwok Wing, San Francisco, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 67 days.

(21) Appl. No.: 10/065,420

(22) Filed: Oct. 16, 2002

(51) Int. Cl.⁷ ................. H03K 19/003; H03K 17/14
(52) U.S. Cl. ................. 326/32; 326/27; 327/378
(58) Field of Search ................ 326/31–34, 26–27, 326/83, 86; 327/170, 108, 380, 381, 362, 378

(56) References Cited

U.S. PATENT DOCUMENTS

| 4,766,415 A | * | 8/1988 | Dielacher | 341/119 |
| 5,994,945 A | * | 11/1999 | Wu et al. | 327/378 |
| 6,040,737 A | * | 3/2000 | Ranjan et al. | 327/543 |
| 6,535,020 B1 | * | 3/2003 | Yin | 326/83 |

FOREIGN PATENT DOCUMENTS

| JP | 06164346 A | * | 6/1994 | .......... H03K/17/16 |

* cited by examiner

*Primary Examiner*—James H. Cho
(74) *Attorney, Agent, or Firm*—Stuart T. Auvinen

(57) ABSTRACT

Edge rates for output driver transistors are increased for slower conditions such as caused by supply-voltage, temperature, and process variations. The edge rates are increased by increasing charging and discharging currents to the gates of the driver transistors. Process-sensing transistors have gates tied to power or ground. Current through the process-sensing transistors changes with supply-voltage, temperature, and process variations. The currents through process-sensing transistors are used to generate process-compensated voltages that bias current sources and sinks to adjust process-dependent currents. Process-independent or fixed current sources and sinks use process-independent reference voltages ultimately generated from reference currents that are not sensitive to process variations. The process-dependent-currents are subtracted from the fixed currents to produce the charging and discharging currents.

20 Claims, 8 Drawing Sheets

CURRENT-COMPENSATED CMOS OUTPUT BUFFER ADJUSTING EDGE RATE FOR PROCESS, TEMPERATURE, AND VCC VARIATIONS

BACKGROUND OF INVENTION

This invention relates to output buffers, and more particularly to temperature, process, and voltage compensation for an output buffer.

Electronic systems are often constructed from integrated circuits (IC's) using s semiconductor process technology such as a complementary metal-oxide-semiconductor (CMOS) process. CMOS processes are used construct circuits of n-channel and p-channel transistors that sink or source current.

The rise and fall times of outputs of CMOS circuits are often critical parameters. When fall times are too fast, undesirable effects can occur such as ground bounce and ringing. Slow rise and fall times may be more sensitive to external noise coupled into the output. Often the rise and fall times are tightly specified to meet requirements of other circuits driven by the output.

The amount of current passing through a CMOS transistor depends on several factors, such as input and output voltages, temperature, and process variations. For example, less current is delivered at higher temperatures while more current is delivered at lower temperatures. A circuit may often be spec'ed to operate over a wide temperature range, such as 0 to 100 degrees Celsius. The current delivered can double over such a wide temperature range.

When the power-supply voltage (Vdd or Vcc) is raised, input voltages tend to rise, causing transistors to be driven by larger voltages. The higher voltages tend to produce larger currents.

While CMOS processes are carefully controlled, some variation still occurs. For example, the gate length may vary by a certain percentage, such as +/−10%, which can cause a variation in currents. Doping in transistors may vary, increasing or decreasing carrier mobility and capacitances and ultimately affecting current drive. Other process variations can be caused by a wide variety of factors that ultimately lead to current variations.

Various circuits have been devised to compensate for such voltage, temperature, and/or process variations. One common technique is to employ feedback. The output node of an output buffer can be fed back to an upstream node, causing the voltage drive to the gate of the output transistor to be modulated. When supply-voltage, temperature, and process variations cause a larger current to be delivered by the output transistor, then the output voltage changes more quickly, causing the feedback to more rapidly turn off the output transistor or reduce its gate-voltage drive and current drive. Supply voltage, temperature, and process variations that reduce output current can slow the feedback, increasing gate-voltage drive and allowing larger currents to be delivered for a longer period of time to compensate.

While such feedback compensation is useful, undesirable effects similar to oscillation can occur. Such oscillation can cause stability problems. Thus it can be desirable to not use feedback when compensating for supply-voltage, temperature, and process variations.

What is desired is a compensation circuit for a CMOS output buffer. An output buffer that compensates for supply-voltage, temperature, and process variations is desirable.

DETAILED DESCRIPTION

The present invention relates to an improvement in compensated buffers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
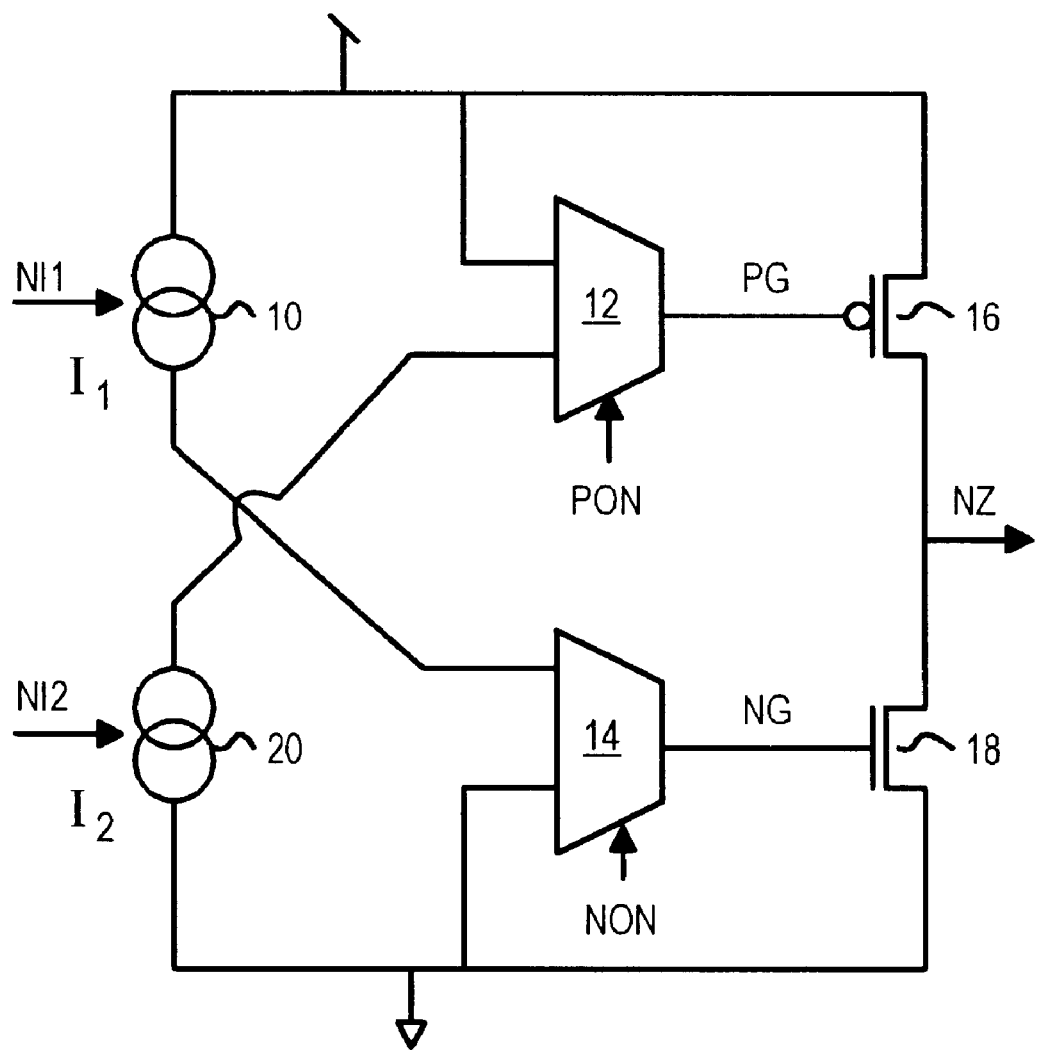
FIG. 1 is a simplified block diagram of an output buffer that is compensated for supply-voltage, temperature, and process variations.

FIG. 1 is a simplified block diagram of an output buffer that is compensated for supply-voltage, temperature, and process variations. Output node NZ is driven high when p-channel driver transistor 16 is turned on, but driven low when n-channel driver transistor 18 is turned on. Output NZ can be tri-stated or placed in a high-impedance state by driving the gate PG of p-channel driver transistor 16 high through mux 12, and by driving the gate NG of n-channel driver transistor 18 low though mux 14.

Driver transistors 16, 18 are normally large size transistors with large gates. The large gates provide a large input capacitance that must be charged or discharged to turn the driver transistors on and off. The rate that these input capacitances are charged or discharged determines the edge rate of the output node NZ. Controlling the edge rates of gate nodes NG and PG can thus control the edge rate of output node NZ.

For example, when output NZ is to be driven low, control signal NON goes high, causing mux 14 to connect current 11 from current source 10 to gate node NG. As current 11 charges gate node NG, n-channel driver transistor 18 turns on, pulling output node NZ lower.

The fall rate of NZ is determined by the rise rate of gate node NG, which is controlled by the size of current 11. Current 11 from current source 10 can be adjusted through control voltage NI1 to compensate for supply-voltage, temperature, and process variations. For example, when the temperature is low and Vcc is high, and the process is fast, current 11 can be reduced by adjusting control voltage NI1. This reduces the charging speed of gate node NG and slows the falling edge of NZ.

Likewise, when output NZ is to be driven high, control signal PON goes low, causing mux 14 to connect current 12 from current sink 20 to gate node PG. As current 12 discharges gate node PG, p-channel driver transistor 16 turns on, pulling output node NZ higher.

The rising-edge rate of NZ is determined by the falling rate of gate node PG, which is controlled by the size of current 12. Current 12 from current sink 20 can be adjusted through control voltage N12 to compensate for supply-voltage, temperature, and process variations. When the temperature is low, Vcc is high, and the process is fast, current 12 can be reduced by adjusting control voltage N12. This reduces the discharging speed of gate node PG and slows the rising edge of NZ.

Rather than use a single current source to drive the n-channel driver gate, a difference of two current sources can be used. The current difference between the two current sources is the charging current sent to the n-channel driver gate. One of the two current sources can be a fixed, process-independent current source, while the other current source is a variable, process-dependent, current source.

Figure 2A:
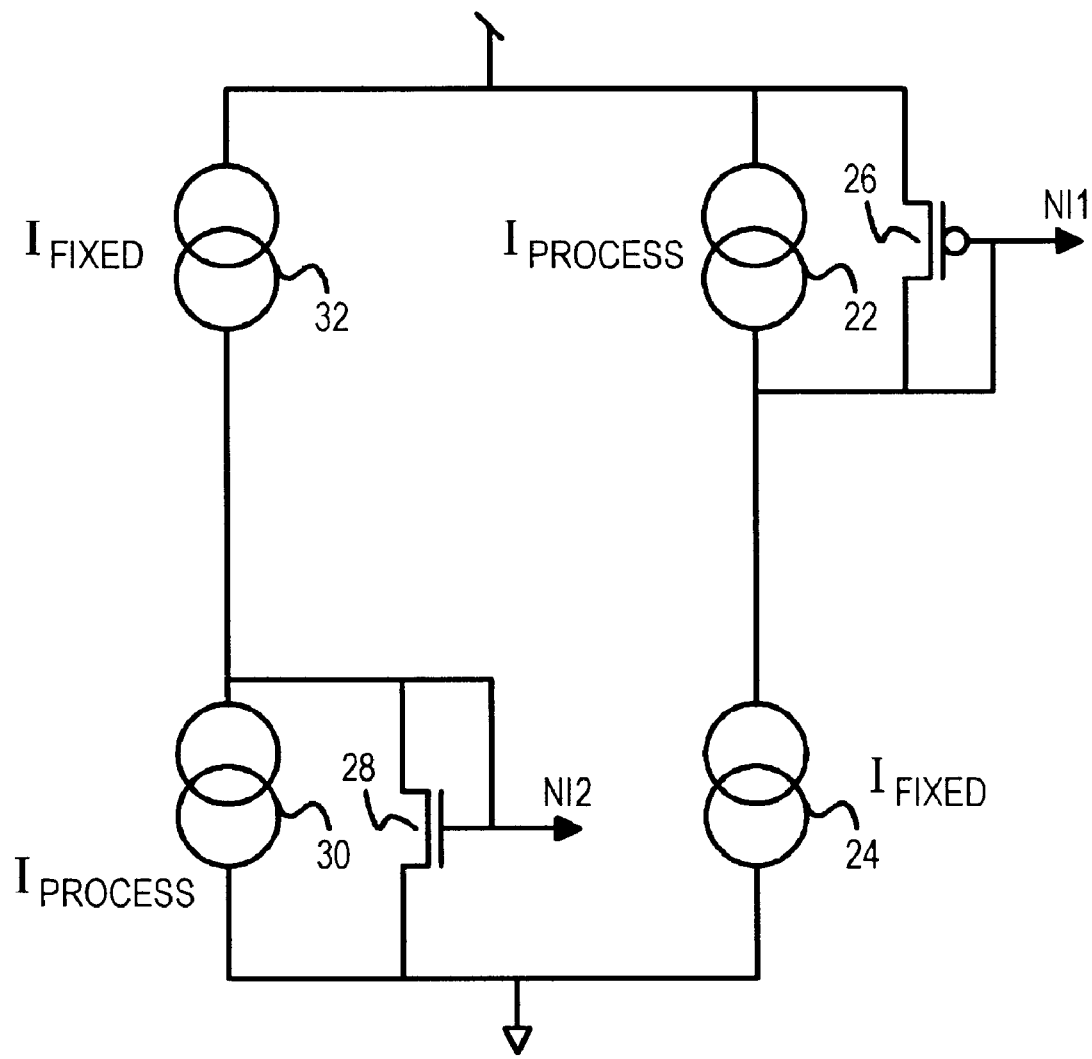
FIG. 2A highlights compensation using fixed and process-variable current sources.

FIG. 2A highlights compensation using a difference in currents from fixed and variable current sources. The control voltages NI1 and N12 can be generated by mirroring gate voltages of transistors in parallel with process-dependent current sources. Control voltage N12, which controls the NG charging current, is the gate and drain of n-channel transistor 28, which responds to the voltage between fixed current source 32 and process-dependent variable current sink 30. Fixed current source 32 is process-independent, being generated by a reference current source. Control voltage N12 and the compensation current are determined by the difference of the fixed and variable currents, $I_{fixed}-I_{process}$.

Similarly, the P-gate compensation current is the difference of the fixed and process-dependent currents, from fixed current sink 24 and process-dependent variable current source 22. P-channel transistor 26 has its gate and drain connected together as control voltage NI1 and to the node between variable current source 22 and fixed current sink 24.

Figure 2B:
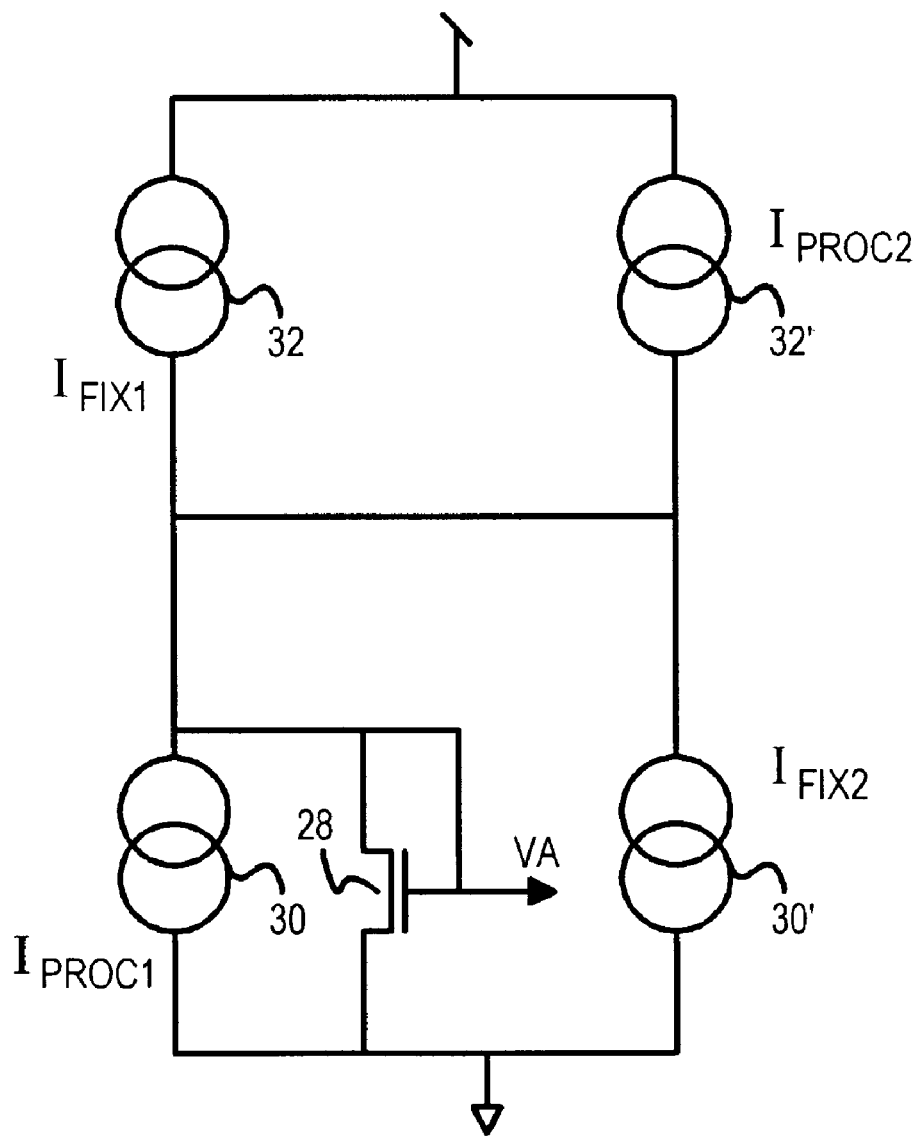
FIG. 2B shows compensation using two current sources for compensation of the p-channel pull-up driver.

Additional fine-tuning of compensation can be provided by using four control voltages rather than just two. FIG. 2B shows compensation using two currents for compensation of the p-channel pull-up-driver. Only the pullup driver's compensation is shown for simplicity, but a similar circuit could be used for pull-down driver compensation.

Control voltage VA is generated by mirroring a current difference between fixed current source 32 and variable current sink 30. The difference in current, $I_{fix1}-I_{proc1}$, is sent through n-channel mirror transistor 28, setting control voltage VA. As process or other conditions change, the current through variable current sink 30 changes, altering the current difference through n-channel mirror transistor 28 and adjusting control voltage VA. The adjustments in control voltage VA are mirrored to adjust pull-up current from the p-channel driver transistor.

Control voltage VD is similarly generated by mirroring a current difference between variable current source 32' and fixed current sink 30'. The difference in current, $I_{proc2}, -I_{fix2}$ is also sent through n-channel mirror transistor 28, setting control voltage VA. As process or other conditions change, the current through variable current source 32 changes, altering the current difference through n-channel mirror transistor 28 and adjusting control voltage VA.

Fixed current sources 32, and sink 30' are process-independent, being generated by a reference current source. Control voltage VA is determined by the net difference of the fixed and variable currents, $I_{fix1}-I_{proc1}$ and $-I_{proc2}-I_{fix2}$.

Figure 3:
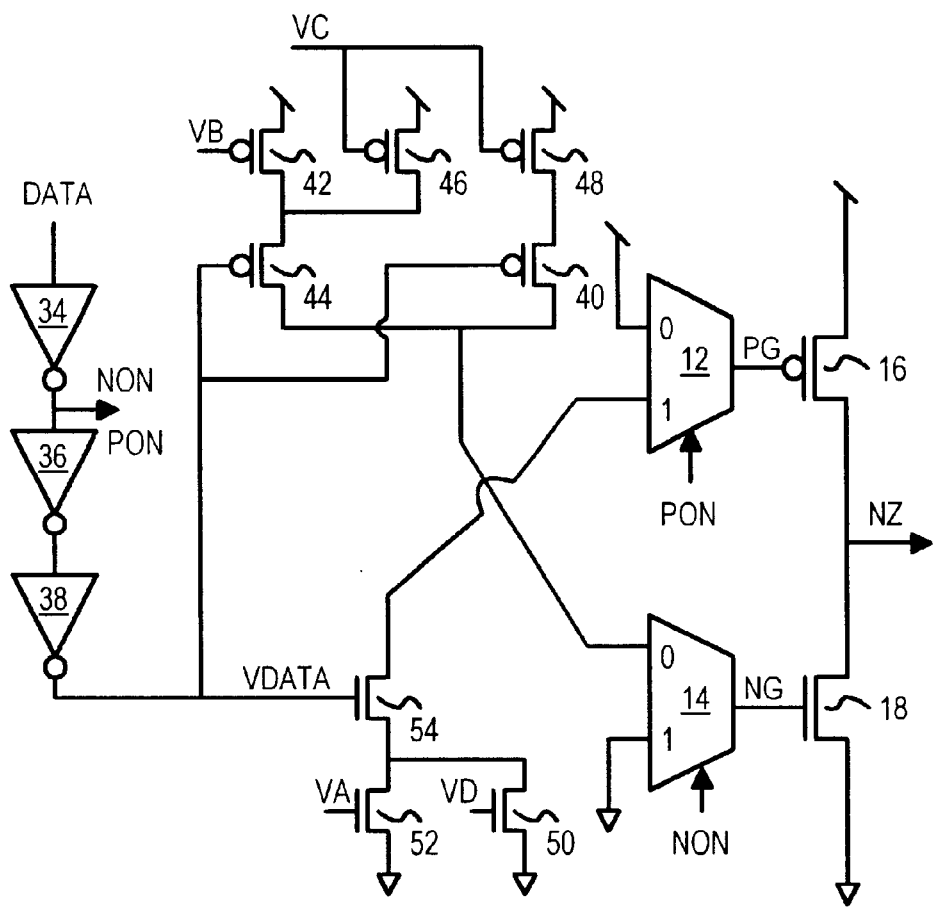
FIG. 3 shows a compensated output buffer using four control voltages.

FIG. 3 shows a compensated output buffer using four control voltages. Muxes 12, 14 are controlled by signals PON, NON that are generated from the data signal DATA by inverters 36, 36. Additional gates for PON, NON, and DATA can be used when output NZ is to be tri-stated.

When DATA goes low, NON goes high causing mux 14 to charge gate node NG of n-channel driver transistor 18. Charging current is provided by p-channel transistors 40, 44, which have their gates driven low by inverter 38. Current through transistor 40 is provided by p-channel source transistor 48, which has its gate driven by control voltage VC. Current through transistor 44 is provided by p-channel source transistor 42 which is in parallel with p-channel source transistor 42. The gate of source transistor 42 is driven by control voltage VB while gate of source transistor 46 is driven by control voltage VC. Thus the charging current of NG is compensated by control voltages VB and VC.

When DATA goes high, PON goes low causing mux 12 to discharge gate node PG of p-channel driver transistor 16. Discharging current is provided by n-channel transistor 54, which has its gate driven high by inverter 38. Current through transistor 54 is provided by n-channel sink transistor 50, which is in parallel with n-channel sink transistor 52. The gate of sink transistor 50 is driven by control voltage VD while gate of sink transistor 52 is driven by control voltage VA. Thus the discharging current of PG is compensated by control voltages VA and VD.

When data goes low again, PON goes high, causing mux 12 to charge node PG to turn off driver transistor 16. Likewise, when data goes high, NON goes low, causing mux 14 to discharge node NG to ground to turn off driver transistor 18.

The four control voltages VA, VB, VC, VD are adjusted to cause the desired compensation for supply-voltage, temperature, and process variations. Using four control voltages rather than just two allows for better fine tuning of the compensation adjustments.

Figure 4:
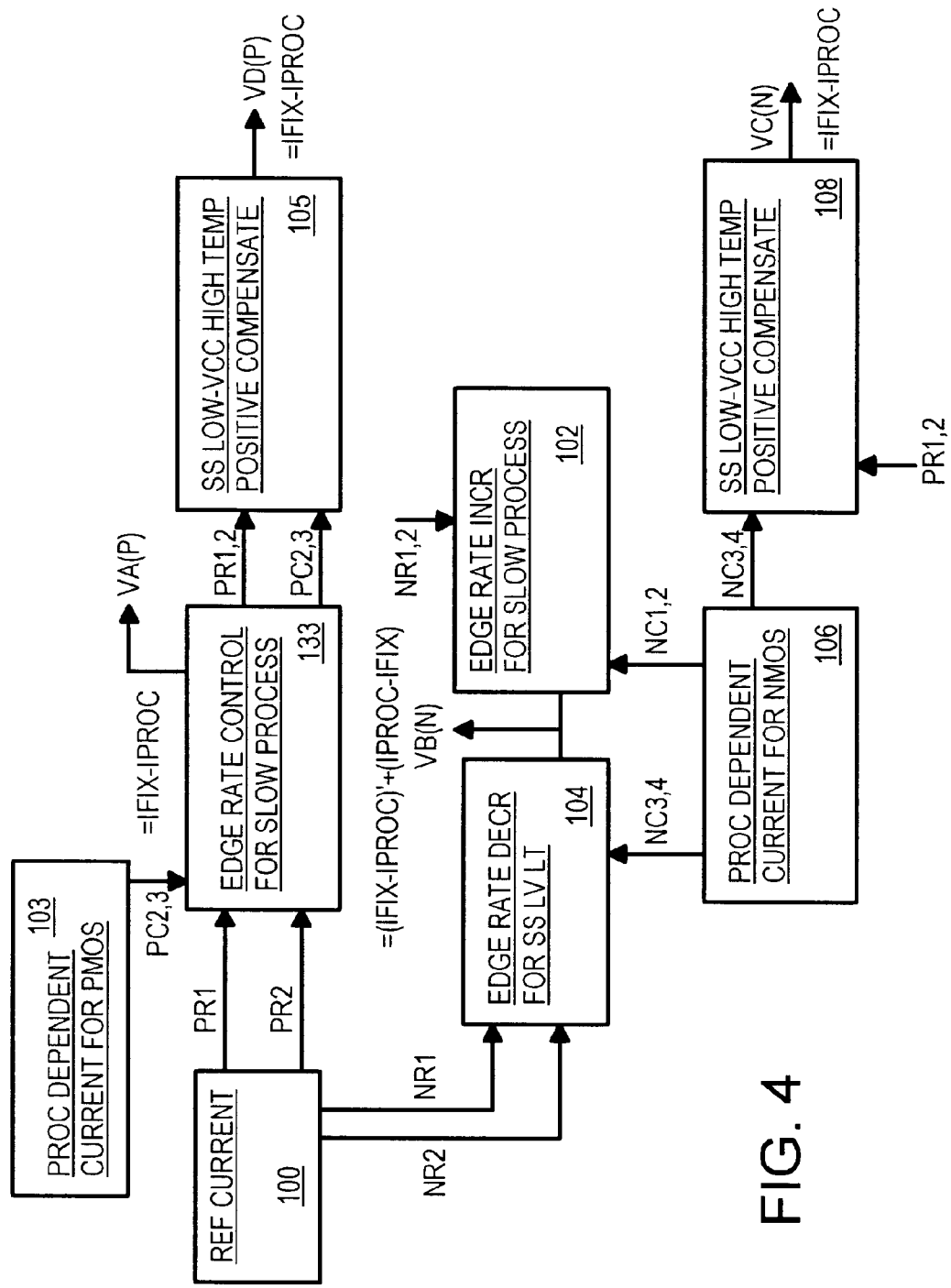
FIG. 4 is a block diagram showing generation of the four control voltages that compensate for supply-voltage, temperature, and process variations.

FIG. 4 is a block diagram showing generation of the four control voltages that compensate for supply-voltage, temperature, and process variations. Reference current generator 100 uses a band-gap reference or a resistor to generate process-independent reference currents. Reference voltages PR1, PR2 are sent to PMOS edge-rate controller 133 while reference voltages NR1 and NR2 are sent to NMOS edge-rate decreaser 104 and NMOS edge-rate increaser 102. NMOS edge-rate decreaser 104 receives compensated voltages NC3, NC4 from NMOS process compensator 106 while NMOS edge-rate increaser 102 receives compensated voltages NC1, NC2 from NMOS process compensator 106. The NMOS compensators adjusts the final output's pull-down current while the PMOS compensator adjusts the output's pull-up current.

The p-channel output-driver transistor is compensated by control voltages VA, VD. Control voltage VA is generated by PMOS edge rate controller 103 directly using a difference of fixed and variable currents, $I_{fix}-I_{proc}$. Control voltage VD is generated by PMOS positive compensator 105, which receives compensated voltages PC2, PC3 and reference voltages PR1, PR2 from PMOS process compensator 103. The process-compensated voltages PC2, PC3 adjust the n-channel pull-down transistors while the fixed reference voltages PR1, PR2 drive p-channel transistors. The current difference is $I_{fix}-I_{proc}$ where the fixed current is from the p-channel pull-ups and the process-dependent current is from the n-channel pull-downs.

For slow process, voltage, and temperature conditions, the PMOS driver's edge rate is increased by PMOS edge-rate controller 103, and decreased by PMOS positive compensator 105. Different transistors sizes can be used to produce different fixed or variable currents. Thus control voltage VD corrects over-compensation by control voltage VA.

The n-channel driver transistor is compensated by control voltages VB, VC.

Control voltage VB is generated by both NMOS edge-rate increaser 102 and NMOS edge-rate decreaser 104 in parallel. NMOS edge-rate decreaser 104 contributes a current difference of the inverse of $I_{fix}-I_{proc}$ while NMOS edge-rate increaser 102 contributes a current difference of $I_{proc}-I_{fix}$. The $I_{fix}$ and $I_{proc}$ currents can be different for 102 and 104 and for other blocks. NMOS edge-rate decreaser 104 has reference voltages applied to the p-channel pullup transistors and process-compensated voltages applied to the n-channel pull-down transistors to produce $I_{fix}-I_{proc}$ while NMOS edge-rate increaser 102 has process-compensated voltages applied to the p-channel pullup transistors and reference voltages applied to the n-channel pull-down transistors to produce $I_{proc}-I_{fix}$.

Control voltage VC is generated by NMOS positive compensator 108, which receives compensated voltages NC3, NC4 from NMOS process compensator 106 and reference voltages PR1, PR2, from reference current generator 100. NMOS positive compensator 108 has reference voltages PR1, PR2 applied to the p-channel pullup transistors and process-compensated voltages NC3, NC4 applied to the n-channel pull-down transistors to produce $I_{fix}-I_{proc}$ as the current difference that generates control voltage VC.

For slow process, voltage, and temperature conditions, the NMOS driver's edge rate is increased by NMOS edge-rate increaser 102 using control voltage VB. The edge rate is also decreased by NMOS positive compensator 108 generating control voltage VC. Control voltage VB is re-adjusted by NMOS edge-rate decreaser 104.

Figure 5:
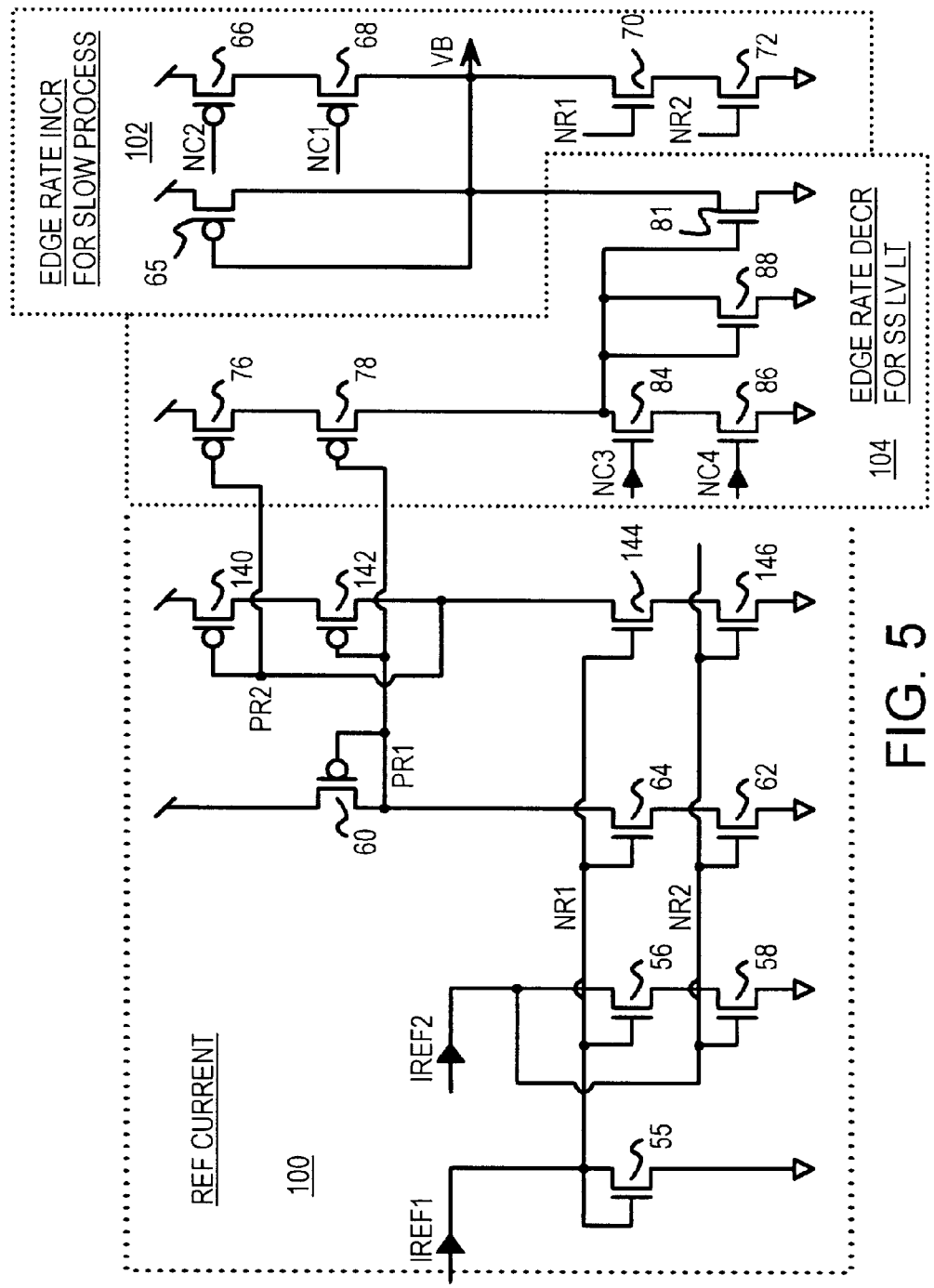
FIG. 5 is a schematic of the reference current generator driving the NMOS edge-rate increaser and the NMOS edge-rate decreaser.

FIG. 5 is a schematic of the reference current generator driving the NMOS edge-rate increaser and the NMOS edge-rate decreaser. Reference currents IREF1 and IREF2 are generated by a process-independent manner, such as by a band-gap reference circuit or an external resistor. Reference current IREF flows through the channel of n-channel transistor 55, which has its gate and drain tied together. The gate-drain voltage produced is reference voltage NR1.

Reference voltage NR1 is applied to the gate of n-channel transistor 56, which is in series with n-channel transistor 58. Reference current IREF2 flows through the channels of transistors 56, 58. The gate of transistor 58 is connected to the drain of transistor 56, which is output as reference voltage NR2. Finally reference voltages NR1 and NR2 are applied to the gates of n-channel transistors 64, 62, respectively, which sink current from p-channel transistor 60. The gate and drain of p-channel transistor 60 are connected together as reference voltage PR1.

Another reference voltage, PR2, is generated at the drains of p-channel transistor 142 and n-channel transistor 144. P-channel transistors 140, 142 and n-channel transistors 144, 146 are in series and receive voltages PR2, PR1, NR1, NR2, respectively, at their gates. Reference voltage PR2 is also process-independent since only reference voltages and not compensated voltages are input to transistors 140, 142, 144, 146.

Reference voltages NR1, NR2, PR1 and PR2 are sent to other blocks and act as process-independent references, although they may have some process dependencies. For example, NMOS edge-rate increaser 102 receives NR1 on the gate of n-channel transistor 70, and NR2 on the gate of n-channel transistors 72. The drain of transistor 70 is output as control voltage VB, while current through transistor 70 is sunk by transistor 72. Current is sunk from VB in a process-independent manner using references NR1, NR2. However, The pull-up current from control voltage VB depends on the supply-voltage, temperature, and process variations since p-channel transistors 66, 68 in series have gates driven by process-compensated voltages, NC2 and NC1, respectively, from NMOS process compensator 106 (FIG. 6).

Current from process-dependent transistor 66 passes through p-channel transistor 68 to the control node for voltage VB. Additional current is sourced by p-channel transistor 65, which has its gate and drain connected together.

NMOS edge-rate decreaser 104 receives reference voltage PR1 from reference current generator 100, which is applied to the gate of p-channel transistor 78. Another reference voltage PR2 is applied to the gate of p-channel transistor 76. Transistors 78, 76 form a series pullup that is process-independent, since both references PR1, PR2 are generated by reference current generator 100.

Figure 6:
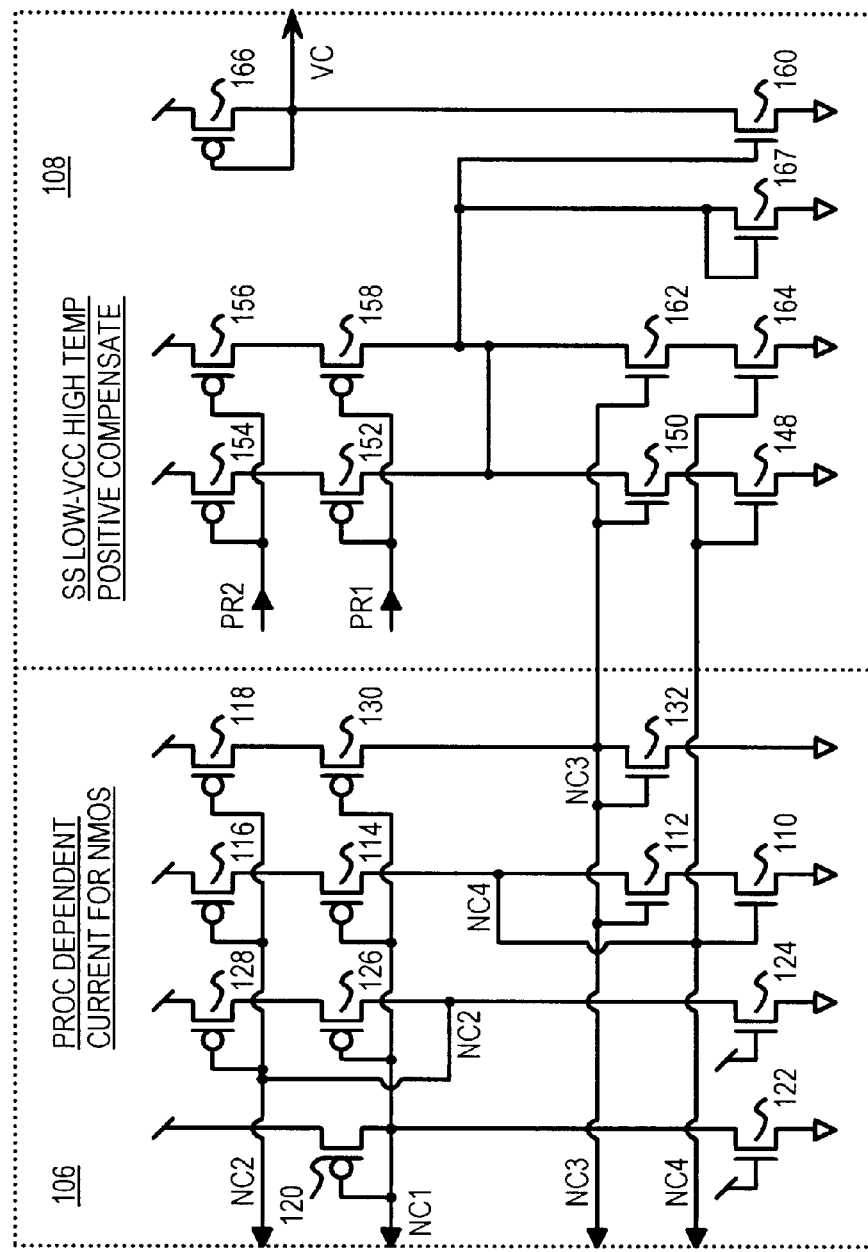
FIG. 6 is a schematic of the NMOS process compensator and the NMOS positive compensator.

Current sunk in NMOS edge-rate decreaser 104 is process-compensated by n-channel transistors 84, 86, 88 since compensated voltages NC3 and NC4 are received from NMOS process compensator 106 (FIG. 6). NC3 is applied to the gate of n-channel transistor 84 which is in series with p-channel transistors 76, 78 and n-channel transistor 86. Transistor 86 receives NC4 at its gate. The output of this series of transistors 76, 78, 84, 86 is the drains of transistors 78, 84, which is applied to the gate and drain of n-channel transistor 88 and the gate of n-channel transistor 81. current flowing into n-channel transistor 88 is equal to the current through transistor 76 minus the current through transistor 86. N-channel transistor 81 mirror this current to p-channel transistor 65 to establish VB. However under some conditions this current is further adjusted by transistors 66, 68, 70, 72.

Current is sunk from VB to ground by n-channel transistor 81. N-channel transistor 81 acts to invert the compensation to node VB since a higher drain voltage on transistors 78, 84 increases gate drive and current through n-channel transistor 81, which drops voltage VB. Voltage VB is generated by the combination of current from all the branches connected to transistor 65. Edge rate is decreased by NMOS edge-rate decreaser 104 but increased by NMOS process compensator 106.

Thus for NMOS edge-rate increaser 102 the pullup current from control node VB temperature, voltage, and process-dependent due to compensated voltages NC1, NC2, while only the pulldown current depends on supply-voltage, temperature, and process variations for NMOS edge-rate decreaser 104 since reference voltages PR1, PR2 are applied to the pull-ups while compensated voltages NC3, NC4 are applied to the pulldowns.

Lower voltages of VB produce higher currents to the n-driver's gate node (NG), increasing the driver's falling edge rate. NMOS edge-rate increaser 102 tends to lower VB since the reference-only pulldown of transistors 70, 72, draws more current than the compensated pullup of transistors 66, 68, which draw less current for weaker process conditions.

A fixed or process-insensitive current sink for node VB is provided by n-channel transistors 70, 72, since they receive process-insensitive reference voltages NR1, NR2.

A variable process-sensitive current source is provided by p-channel transistors 66, 68, since they receive process-compensated voltages NC1, NC2 at their gates. Thus a process-compensated pull-up current is subtracted from a fixed pull-down current to generate control voltage VB.

NMOS edge-rate decreaser 104 increases VB for slower supply-voltage, temperature, and process variations since the pullup is process-independent while the pulldown depends on compensated voltages (NC3, NC4) and is inverted through transistor 81 to node VB.

At slower process conditions, lower values of NC3, NC4 are produced. The lower values of NC3, NC4 reduce current in n-channel transistors 84, 86, raising the drain voltage of transistor 84 and increasing gate voltage and current drive of n-channel transistor 81, causing node VB to be lowered. Transistors 84, 86, 81 have an inverting effect. Lower values of control voltage VB produce faster charging currents of the gate of the p-channel driver, compensating for slower conditions.

FIG. 6 is a schematic of the NMOS process compensator and the NMOS positive compensator. NMOS process compensator 106 has no inputs and generated compensated voltages NC1, NC2, NC3; and NC4. Process-sensing n-channel transistors 122, 124 have their gates tied to the power supply and sense supply-voltage, temperature, and process variations that alter their drain currents. Process-sensing transistor 122 has its drain connected to the drain of p-channel transistor 120, which has its gate and drain connected together as compensated voltage NC1. The purpose of NC1 is to ensure that the transistor connected to NC2 is always in saturation. The compensated current is actually controlled by NC2, and not NC1. This circuit configuration is a technique to create cascode circuits that have a very low saturation voltage.

Current sunk by process-sensing transistor 124 is sourced by p-channel transistors 126, 128 in series. Voltage NC1 is applied to the gate of transistor 126, while the gate of transistor 128 is connected to the drains of transistors 124, 126 and output as compensated voltage NC2.

As supply-voltage, temperature, and process variations reduce current in process-sensing transistors 122, 124, less current is drawn through p-channel transistors 120, 126 and their drain voltages, compensated voltages NC1 and NC2, rise to reduce drain current.

Higher values of compensated voltages NC1, NC2 produce lower currents in p-channel transistors 114, 116, 118, 130. Lower currents in transistors 112, 132 produce lower gate-drain voltages and lower compensated voltages NC3, NC4. Lower values of NC3, NC4 produce lower values at node VC due to the inverting effect of transistors 162, 164 and 160. Lower values of control voltage VC produce faster charging currents of the gate of the p-channel driver, compensating for slower conditions.

Compensated voltages NC1 and NC2 are used to generate two more voltages: compensated voltages NC3 and NC4. Voltage NC1 is applied to the gates of p-channel transistors 114, 130, while voltage NC2 is applied to the gates of p-channel transistors 116, 118.

Compensated voltage NC3 is from the drains of n-channel transistor 132 and p-channel transistor 130, which are in series with p-channel transistor 118. Compensated voltage NC4 is output by the drains of p-channel transistor 114 and n-channel transistor 112. The gate of n-channel transistor 110 is connected to voltage NC4. Transistors 116, 114, 112, 110 are in series.

Compensated voltages NC3, NC4 are input to NMOS positive compensator 108, along with reference voltages PR1, PR2. Transistors 154, 152, 150, 148 supply additional current, or the sizes of other transistors can be increased.

These reference voltages PR2, PR1 are applied to the gates of p-channel transistors 156, 158. Compensated voltages NC3, NC4 are applied to the gates of n-channel transistors 162, 164. Transistor 167 has its gate and drain connected together at as the gate input to transistor 160. Transistors 156, 158, 162, 164 are in series and the drains of transistors 158, 162 are output to the gate of n-channel transistor 160, which inverts and buffers the output to generate control voltage VC. The drain of transistor 160, voltage VC, is also the drain of p-channel pullup transistor 166, which has its gate connected to its drain (VC).

Since the gates of pullup p-channel transistors 156, 158 receive process-independent references PR2, PR1, the pullup current is process-independent.

However, pulldown n-channel transistors 162, 164 receive process-compensated voltages NC3, NC4. So only pulldown current is process compensated. Slower process conditions produce lower currents in NMOS process compensator 106 and lower voltages NC3, NC4. The lower NC3, NC4 voltages produce less pull-down current, causing the drain voltage of transistors 158, 162 to rise, increasing gate drive at inverting transistor 160, lowering VC. The lower VC increases output current drive to compensate for slower conditions.

Figure 7:
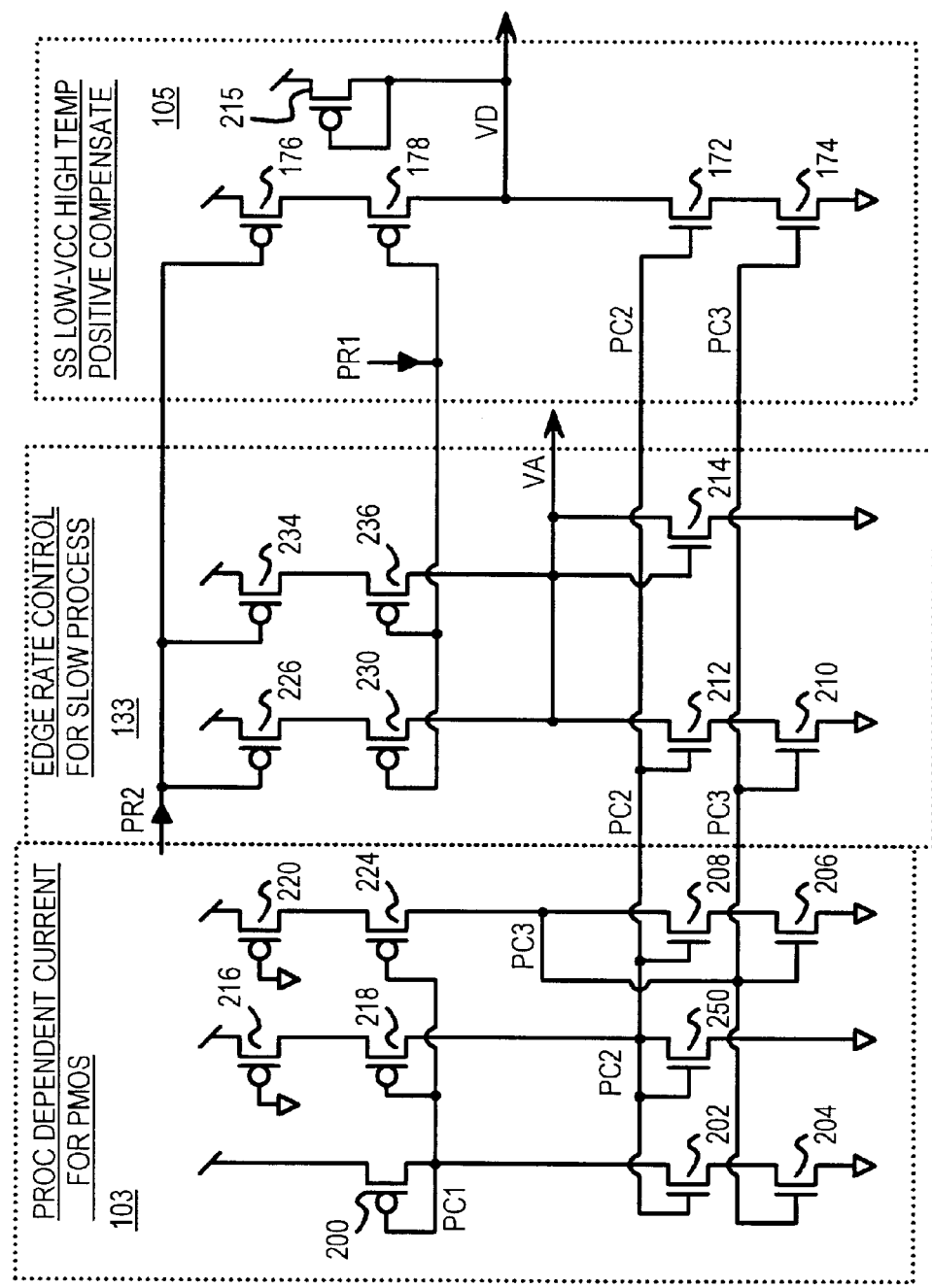
FIG. 7 is a schematic of the PMOS process compensator and the PMOS positive compensator.

FIG. 7 is a schematic of the PMOS process compensator and the PMOS positive compensator. A process-dependency, or dependency on supply-voltage, temperature, and process variations is introduced by process-sensing p-channel transistors 216, 220, which have their gates connected to ground. The drain current through transistors 216, 220 depends on supply-voltage, temperature, and process variations and not on input voltages.

PMOS process compensator 103 uses process-sensing p-channel transistor 216 as a current source in series with p-channel transistor 218, which has its gate driven by compensated voltage PC1. The current through p-channel transistors 216, 218 is supplied to n-channel transistor 250, which has its gate and drain connected together as compensated voltage PC2.

Process-sensing p-channel transistor 220 is in series with p-channel transistor 224, which also has its gate driven by compensated voltage PC1. These transistors supply current to n-channel transistors 208, 206, which are in series to ground. The gate of transistor 208 is compensated voltage PC3, while the gate of transistor 206 is connected to the drains of transistors 208, 224 and is output as compensated-voltage PC3.

Compensated voltage PC1 is generated from compensated voltages PC2, PC3. N-channel transistors 202, 204 are in series and receive voltages PC2, PC3, respectively on their gates. They sink current from p-channel transistor 200, which has its gate and drain connected together as compensated voltage PC1.

Thus compensated voltages PC2, PC3, PC1 are generated from process-sensing transistors 216, 220 without any external inputs other than power and ground.

Control voltage VA is generated by PMOS edge-rate controller 133. Process-independent current sources are used. P-channel transistors 226, 230 are in series and receive reference voltages PR2, PR1, respectively, at their gates. In parallel to node VA with transistors 226, 230, p-channel transistors 234, 236 are in series together and also receive reference voltages PR2, PR1, respectively, at their gates. A single series of double-size transistors could be substituted.

Process-compensated pull-down current is provided by n-channel transistors 212, 220, which receive compensated voltages PC2, PC3, respectively, at their gates and are in series between node VA and ground. Current are received by n-channel transistor 214, which has its gate and drain connected together at node VA. Current through transistor 214 is equal to current through transistors 226 and 234 minus current through transistor 210. Current through transistors 226 and 234 are process independent currents, which current through transistor 210 is a process, temperature and power supply dependent current.

Control voltage VA from node VA is thus process-compensated for pull-down current but not for pull-up current. A fixed pull-up current source is combined with a process-dependent variable current sink.

Compensated voltages PC2, PC3 are output by PMOS process compensator 103 to PMOS positive compensator 105. Voltage PC2 is applied to the gate of n-channel transistor 172 while voltage PC3 is applied to the gate of n-channel transistor 174. Together transistors 172, 174 in series sink current from node VD, producing control voltage VD. P-channel transistors 176, 178 in series provide a current source to node VD. Reference voltage PR2 is applied to the gate of transistor 176, while voltage PR1 is applied to the gate of transistor 178. The net current from transistors 178, 172 is received by p-channel transistor 215, which has its gate and drain connected together at VD.

A fixed pull-up current source of p-channel transistors 176, 178 receiving process-insensitive or fixed references PR2, PR1 is combined with a process-dependent variable current sink of n-channel transistors 172, 174, which receive process-compensated voltages PC2, PC3.

Larger values of control voltages VA, VD produce more current to discharge the gate of the p-channel driver transistor and thus increase the rising edge rate when supply-voltage, temperature, and process variations slow outputs. Larger VA, VD occur when PC2 and PC3 are higher. Compensated voltages PC2, PC3 are lower when less current is pulled through n-channel transistors 250, 206, which occurs when process or other variations reduce current in process-sensing p-channel transistors 216, 220.

VA and VD are for compensation at different process corners, temperatures and power supply voltages. In some cases VA and VD might counter each other, in other cases they may act together. It depends on what currents the designer chooses for reference and compensation currents.

ALTERNATE EMBODIMENTS

Several other embodiments are contemplated by the inventor. For example additional devices such as capacitors, resistors, transistors, and buffer stages may be added at various locations in the circuits. Large transistors may be split into two or more smaller transistors, and smaller parallel transistors may be combined into a larger transistor. Multi-gate and stacked-gate transistors may be substituted. More current-summing networks may be added to further adjust the compensation current.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R.§ 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many-modifications and variations are possible in light of the above teaching. It is intended that the scope of the invention be limited not by this detailed description, but rather by the claims appended hereto.

What is claimed is:

1. A process-compensated output buffer comprising:
    a reference voltage generator, receiving a reference current having substantially no process dependency, for generating p-channel reference voltages and n-channel reference voltages having substantially little process dependency;
    a PMOS process compensator, receiving the p-channel reference voltages from the reference voltage generator, for generating a first control voltage between a; frost fixed current source that receives the p-channel reference voltages and a frost process-compensated current sink;
    a first control transistor for adjusting discharge current from a p-driver gate in response to the first control voltage;
    an NMOS process compensator for generating process-compensated voltages that have a substantial process dependency;
    an NMOS edge-rate increaser, receiving the n-channel reference voltages from the reference voltage generator and the process-compensated voltages from the NMOS process compensator, for generating a second control voltage between a fixed current sink that receives the n-channel reference voltages and a process-compensated current source that receives the process-compensated voltages; and
    a second control transistor for adjusting charge current to an n-driver gate in response to the second control voltage,
    whereby charge and discharge currents of driver gates are process-compensated.

2. The process-compensated output buffer of claim 1 further comprising:
    an NMOS positive compensator, receiving the p-channel reference voltages from the reference voltage generator and the process-compensated voltages from the NMOS process compensator, for generating a third control voltage between a second fixed current source that receives the p-channel reference voltages and a second process-compensated current sink that receives the process-compensated voltages; and
    a third control transistor for also adjusting charge current to the n-driver gate in response to the third control voltage;

whereby charge current is adjusted by both the second and third control voltages.

3. The process-compensated output buffer of claim 2 further comprising:

an NMOS edge-rate decreaser, coupled to adjust the second control voltage from the NMOS edge-rate increaser, receiving the p-channel reference voltages from the reference voltage generator and the process-compensated voltages from the NMOS process compensator, for generating an inverted voltage between a third fixed current source that receives the p-channel reference voltages and a third process-compensated current sink that receives the process-compensated voltages; and inverting means, receiving the inverted voltage from the NMOS edge-rate decreaser, for inverting adjustments to the inverted voltage to adjust the second control voltage.

4. The process-compensated output buffer of claim 3 further comprising:

a PMOS positive compensator receiving the p-channel reference voltages from the reference voltage generator and receiving process-compensated voltages from the PMOS process compensator, for generating a second inverted voltage between a fourth fixed current source that receives the p-channel reference voltages and a fourth process-compensated current sink that receives the process-compensated voltages from the PMOS process compensator; and second inverting means, receiving the inverted voltage from the PMOS positive compensator, for inverting adjustments to the second inverted voltage to adjust the second control voltage.

5. The process-compensated output buffer of claim 4 wherein the NMOS edge-rate increaser comprises:

a first p-channel transistor having a gate receiving a first process-compensated voltage;

a second p-channel transistor, having a gate receiving a second process-compensated voltage;

a first n-channel transistor having a gate receiving a first n-channel reference voltage;

a second n-channel transistor having a gate receiving a second n-channel reference voltage;

wherein the first p-channel transistor, the second p-channel transistor, the first n-channel transistor, and the second n-channel transistor are in series; and a first p-channel mirror transistor having a gate and a drain connected together and to the second control voltage and to drains of the first p-channel transistor and the first n-channel transistor.

6. The process-compensated output buffer of claim 5 wherein the NMOS edge-rate decreaser comprises:

a third p-channel transistor having a gate receiving a first p-channel reference voltage;

a fourth p-channel transistor, having a gate receiving a second p-channel reference voltage;

a third n-channel transistor having a gate receiving a third process-compensated voltage;

a fourth n-channel transistor having a gate receiving a fourth process-compensated voltage;

wherein the third p-channel transistor, the fourth p-channel transistor, the third n-channel transistor, and the fourth n-channel transistor are in series;

a second mirror n-channel transistor, having a gate and a drain connected together and to drains of the third p-channel transistor and the third n-channel transistor; and a first inverting n-channel transistor, having a gate connected to drains of the third p-channel transistor and the third n-channel transistor and having a drain connected to the second control voltage.

7. The process-compensated output buffer of claim 6 wherein the NMOS positive compensator comprises:

a fifth p-channel transistor having a gate receiving the first p-channel reference voltage;

a sixth p-channel transistor, having a gate receiving the second p-channel reference voltage;

a fifth n-channel transistor having a gate receiving a third n-channel reference voltage;

a sixth n-channel transistor having a gate receiving a fourth n-channel reference voltage;

wherein the fifth p-channel transistor, the sixth p-channel transistor, the fifth n-channel transistor, and the sixth n-channel transistor are in series;

a second inverting n-channel transistor, having a gate connected to drains of the fifth p-channel transistor and the fifth n-channel transistor and having a drain connected to the third control voltage; and a third p-channel mirror transistor having a gate and a drain connected together and to the third control voltage and to a drain of the second inverting n-channel transistor.

8. The process-compensated output buffer of claim 7 wherein the reference voltage generator comprises:

a first reference n-channel transistor, receiving a first reference current at a drain, having a gate and the drain connected together as a first n-channel reference voltage;

a second reference n-channel transistor, receiving a second reference current at a drain, having a gate driven by the first n-channel reference voltage; and a third reference n-channel transistor, in series with the second reference n-channel transistor, having a gate connected to the drain of the second reference n-channel transistor as a second n-channel reference voltage.

9. A buffer having internal currents compensated for supply-voltage, temperature, and process variations comprising:

a pull-up driver transistor for driving pull-up current to an output in response to a first gate;

a pull-down driver transistor for sinking pull-down current from the output in response to a second gate;

a first control transistor for controlling current to the first gate in response to a first control voltage;

a second control transistor for controlling current to the second gate in response to a second control voltage;

a first fixed current source for producing a first fixed current that is relatively insensitive to supply-voltage, temperature, and process variations;

a first variable current sink for sinking a first variable current that is more sensitive to supply-voltage, temperature, and process variations than is the first fixed current;

a first mirror transistor, coupled to receive a first current difference, for generating the first control voltage in response to the first current difference, the first current difference being a difference between the first fixed current and the first variable current;

a second fixed current sink for sinking a second fixed current that is relatively insensitive to supply-voltage, temperature, and process variations;

a second variable current source for producing a second variable current that is more sensitive to supply-voltage, temperature, and process variations than is the second fixed current; and a second mirror transistor, coupled to supply a second current difference, for generating the second control voltage in response to the second current difference, the second current difference being a difference between the second variable current and the second fixed current, whereby current differences between fixed and process-variable current sources control currents to gates of driver transistors.

10. The buffer of claim 9 further comprising:

a first data transistor in series with the first control transistor, the first data transistor being switched on and off to pass or block current from the first control transistor in response to input data;

a second data transistor in series with the second control transistor, the second data transistor being switched on and off to pass or block current from the second control transistor in response to input data.

11. The buffer of claim 10 wherein the pull-up driver transistor is a p-channel transistor;

wherein the first control transistor and the first data transistor and the first mirror transistor are each an n-channel transistor;

wherein the pull-down driver transistor is an n-channel transistor;

wherein the second control transistor and the second data transistor and the second mirror transistor are each a p-channel transistor.

12. The buffer of claim 11 wherein the first fixed current source comprises a p-channel transistor having a gate driven by a reference voltage that is relatively insensitive to supply-voltage, temperature, and process variations;

wherein the first variable current sink comprises an n-channel transistor having a gate driven by a process-compensated voltage that is relatively sensitive to supply-voltage, temperature, and process variations;

wherein the second fixed current sink comprises an n-channel transistor having a gate driven by a reference voltage that is relatively insensitive to supply-voltage, temperature, and process variations;

wherein the second variable current source comprises a p-channel transistor having a gate driven by a process-compensated voltage that is relatively sensitive to supply-voltage, temperature, and process variations.

13. The buffer of claim 11 wherein the first fixed current source comprises a of p-channel transistors in series having gates driven by reference voltages that are relatively insensitive to supply-voltage, temperature, and process variations;

wherein the first variable current sink comprises a pair of n-channel transistors in series having gates driven by process-compensated voltages that are relatively sensitive to supply-voltage, temperature, and process variations;

wherein the second fixed current sink comprises a pair of n-channel transistors in series having gates driven by reference voltages that are relatively insensitive to supply-voltage, temperature, and process variations;

wherein the second variable current source comprises a pair of p-channel transistors in series having gates driven by process-compensated voltages that are relatively sensitive to supply-voltage, temperature, and process variations.

14. The buffer of claim 13 wherein reference voltages are generated by a band-gap reference while process-compensated voltages are generated by drain voltages of transistors in series with other transistors.

15. The buffer of claim 14 further comprising:

a third control transistor for controlling current to the first gate in response to a third control voltage;

a fourth control transistor for controlling current to the second gate in response to a fourth control voltage;

a third fixed current source for producing a third fixed current that is relatively insensitive to supply-voltage, temperature, and process variations;

a third variable current sink for sinking a third variable current that is more sensitive to supply-voltage, temperature, and process variations than is the third fixed current;

a third mirror transistor, coupled to receive a third current difference, for generating the third control voltage in response to the third current difference, the third current difference being a difference between the third fixed current and the third variable current;

a fourth fixed current sink for sinking a fourth fixed current that is relatively insensitive to supply-voltage, temperature, and process variations;

a fourth variable current source for producing a fourth variable current that is more sensitive to supply-voltage, temperature, and process variations than is the fourth fixed current; and a fourth mirror transistor, coupled to supply a fourth current difference, for generating the fourth control voltage in response to the fourth current difference, the fourth current difference being a difference between the fourth variable current and the fourth fixed current.

16. The buffer of claim 15 wherein the first and third control transistors are in parallel to each other;

wherein the second and fourth control transistors are in parallel to each other, whereby control currents are summed.

17. The buffer of claim 16 further comprising:

a first multiplexer, coupled between the first data transistor and the first gate of the pull-up driver transistor, the first multiplexer having an input connected to a power-supply for disabling the first gate; and a second multiplexer, coupled between the second data transistor and the second gate of the pull-down driver transistor, the second multiplexer having an input connected to a ground for disabling the second gate, whereby multiplexers switch discharge currents to disable driver transistors.

18. A compensated output buffer comprising:

reference voltage generator means, receiving a reference current having substantially no process dependency, for generating p-channel reference voltages and n-channel reference voltages having substantially little process dependency;

PMOS process compensator means, receiving the p-channel reference voltages from the reference voltage generator means, for generating a first control voltage between a fixed current source that receives the p-channel reference voltages and a compensated current sink;

first control transistor means for adjusting discharge current from a p-driver gate in response to the first control voltage;

NMOS process compensator means for generating compensated voltages that have a substantial process dependency;

NMOS edge-rate adjust means, receiving the n-channel reference voltages from the reference voltage generator means and the compensated voltages from the NMOS process compensator means, for generating a second control voltage between a fixed current sink that receives the n-channel reference voltages and a compensated current source that receives the compensated voltages; and second control transistor means for adjusting charge current to an n-driver gate in response to the second control voltage, whereby charge and discharge currents of driver gates are compensated.

19. The compensated output buffer of claim 18 further comprising:

NMOS second compensator means, receiving the p-channel reference voltages from the reference voltage generator means and the compensated voltages from the NMOS process compensator means, for generating a third control voltage between a fixed current source that receives the p-channel reference voltages and a compensated current sink that receives the compensated voltages; and third control transistor means for adjusting charge current to the n-driver gate in response to the third control voltage;

whereby charge current is adjusted by both the second and third control voltages.

20. The compensated output buffer of claim 19 further comprising:

NMOS edge-rate re-adjust means, coupled to adjust the second control voltage from the NMOS edge-rate adjust means, receiving the p-channel reference voltages from the reference voltage generator means and the compensated voltages from the NMOS process compensator means, for generating an inverted voltage between a fixed current source that receives the p-channel reference voltages and a compensated current sink that receives the compensated voltages; and inverting means, receiving the inverted voltage from the NMOS edge-rate re-adjust means, for inverting adjustments to the inverted voltage to adjust the second control voltage.

* * * * *